United States Patent
deVilliers

(10) Patent No.: US 9,466,527 B2
(45) Date of Patent: Oct. 11, 2016

(54) METHOD FOR CREATING CONTACTS IN SEMICONDUCTOR SUBSTRATES

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 40 days.

(21) Appl. No.: 14/626,404

(22) Filed: Feb. 19, 2015

(65) Prior Publication Data

US 2015/0243554 A1  Aug. 27, 2015

Related U.S. Application Data

(60) Provisional application No. 61/943,487, filed on Feb. 23, 2014.

(51) Int. Cl.

| | |
|---|---|
| *H01L 21/768* | (2006.01) |
| *H01L 21/02* | (2006.01) |
| *H01L 21/311* | (2006.01) |
| *H01L 23/522* | (2006.01) |
| *H01L 23/532* | (2006.01) |

(52) U.S. Cl.
CPC ... *H01L 21/76877* (2013.01); *H01L 21/02118* (2013.01); *H01L 21/02359* (2013.01); *H01L 21/31133* (2013.01); *H01L 21/76801* (2013.01); *H01L 21/76816* (2013.01); *H01L 23/5226* (2013.01); *H01L 23/5329* (2013.01); *H01L 2924/0002* (2013.01)

(58) Field of Classification Search
None
See application file for complete search history.

(56) References Cited

U.S. PATENT DOCUMENTS

2006/0124467 A1* 6/2006 Ho .................. B82Y 30/00
                                                205/118
2007/0200477 A1  8/2007 Tuominen et al.
2010/0294740 A1  11/2010 Cheng et al.
2012/0052598 A1* 3/2012 Buckley .............. H01L 21/0331
                                                438/3
2012/0196089 A1* 8/2012 Yang .................. B81C 1/00031
                                                428/156
2013/0189504 A1  7/2013 Nealey et al.
2013/0309457 A1  11/2013 Rathsack et al.
2014/0045341 A1  2/2014 Yonemitsu
2015/0054059 A1* 2/2015 Chen ................. H01L 21/28273
                                                257/325

OTHER PUBLICATIONS

International Application No. PCT/US2015/016626, "International Search Report and Written Opinion," mailed May 28, 2015, International Filing Date Feb. 19, 2015.

* cited by examiner

*Primary Examiner* — Julio J Maldonado
*Assistant Examiner* — Stanetta Isaac
(74) *Attorney, Agent, or Firm* — Wood, Herron & Evans, LLP

(57) ABSTRACT

Techniques include methods for creating contacts for microchips, solar films, etc., for electrically connecting conductive elements and/or for current spreading. Embodiments herein include using an oversized "board" or contact array positioned between a lower layer and an upper layer. This contact array is created by directed self-assembly (DSA) of block copolymers. The lower and upper layers can have conductive structures such as lines. The oversized board can be comprised of hundreds, thousands, millions (etc.) of small conductive contact cylinders, lines or other vertical structures, with each conductive structure electrically isolated from adjacent conductive structures in the array. A crossover location of a line on a lower level with a line on an upper level is connected with multiple conductive structures located at the cross over location.

19 Claims, 6 Drawing Sheets

METHOD FOR CREATING CONTACTS IN SEMICONDUCTOR SUBSTRATES

CROSS REFERENCE TO RELATED APPLICATIONS

The present application claims the benefit of U.S. Provisional Patent Application No. 61/943,487, filed on Feb. 23, 2014, entitled "Method for Creating Contacts in Semiconductor Substrates," which is incorporated herein by reference in its entirety.

BACKGROUND OF THE INVENTION

This disclosure relates to electronic device and semiconductor fabrication. The semiconductor fabrication process consists of several steps to create a completed chip. The steps for fabricating a chip can include: creating a substrate/wafer, depositing film(s), depositing resist(s), creating masks, exposing to light/radiation, develop exposed materials, etching features, cleaning substrates, adding electrical wiring, testing, etc. Many of these individual steps are repeated multiple times during the fabrication of a chip. Development of structures is typically completed many times to create a working microchip. To connect the floors or levels of the structures on a substrate, connectors must be created at exact locations of contact points of both levels.

SUMMARY

Techniques disclosed herein use directed self-assembly of block copolymers for creating electrical contacts for use on various substrates. Directed Self-Assembly (DSA) is a block copolymer process that uses a manufactured polymer that consists of two blocks that are connected or temporarily held together in a mixture, similar to how soap can attach oil to water. The two different blocks (polymers) tend to repel each other. For example, one of the blocks can be attracted to itself while the other block is repelled from itself. Using DSA three different structures can be created based on Kai the Flory interaction parameter and N, the statistical molecular weight and the volume. This parameter can be adjusted to yield different types of structures. Above a required threshold of the ratio of Kai and N to the volume the DSA, a deposited block copolymer film will assemble as spheres, then cylinders, and then lamella (lines). Block copolymer materials can be directed in shape formation and shape orientation, and shape size. The blocks can be selected so that one block material can be etched (removed) selective to the other block material. For example, upon assembling, one material can be harder while the other is softer.

Embodiments disclosed herein include a method for creating contacts for microchips. Embodiments herein include an oversized board covering—in between layers—of an expected crossover location of two lines on different levels. The oversized board can be comprised of hundreds, thousands, millions (etc.) of small conductive contact cylinders, lines or other vertical structures, with each conductive structure electrically isolated from adjacent structures.

One embodiment includes a method for creating electrical contacts on a substrate. This method comprises providing a substrate having a first conductive structure positioned on the substrate. A block copolymer film is deposited on the substrate. The block copolymer film includes a first polymer and a second polymer. Phase separation of the block copolymer film is activated such that a plurality of first structures are formed comprising the first polymer. One or more second structures are also formed comprising the second polymer. Individual structures from the plurality of first structures are vertically-oriented and electrically insulated from each other by the one or more second structures. Multiple individual structures from the plurality of first structures are in contact with the first conductive structure. The plurality of first structures is removed from the substrate while the one or more second structures remain on the substrate and define vertical openings. Electrical contacts are formed by filling the defined vertical openings with an electrically conductive material.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIGS. 9-18 are cross-sectional schematic perspective views of an example substrate segment showing a process flow according to embodiments disclosed herein.

DETAILED DESCRIPTION

Figure 1:
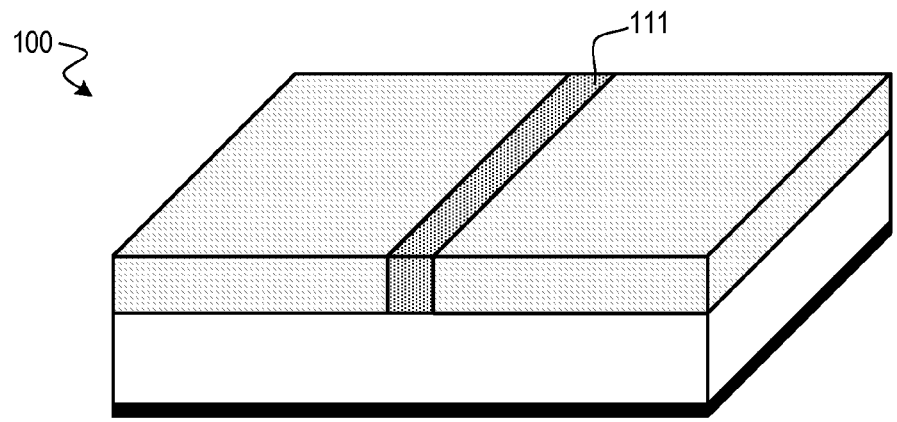
FIGS. 1-9 are cross-sectional schematic perspective views of an example substrate segment showing a process flow according to embodiments disclosed herein.

Embodiments include methods for creating contacts for microchips, solar films, etc., for electrically connecting conductive elements and/or for current spreading. Embodiments herein include using an oversized "board" or contact array positioned between a lower layer and an upper layer. This contact array is created by directed self-assembly (DSA) of block copolymers. The lower and upper layers can have conductive structures such as lines. The oversized board can be comprised of hundreds, thousands, millions (etc.) of small conductive contact cylinders, lines or other vertical structures, with each conductive structure electrically isolated from adjacent conductive structures in the array. A crossover location of a line on a lower level with a line on an upper level is connected with multiple conductive structures located that the cross over location.

There are two primary techniques for directing self-assembly of block copolymers on a circuit. The first technique is chemoepitaxy. Chemoepitaxy involves using a chemical pattern that is placed on a substrate causing self-assemble to align with that pattern. In other words, a chemical pattern on a surface directs the self-assembly of block copolymers. The second technique is graphoepitaxy. Graphoepitaxy involves placing a block copolymer inside patterned caverns or trenches for alignment. In other words, a block copolymer film is deposited within a relief pattern such that physical structures direct self-assembly. For example, DSA can be executed inside the smallest lines that conventional photolithography can create, and then create its own smaller lines.

In general, to create this oversized contact array or "board" a substrate is provided with conductive lines created and the substrate having a generally planar surface. Techniques here can also work with stepped or non-planar surfaces. That is, a substrate of wafer has a pattern of linear structures that are conductive, such as metalized structures, lines, gates, etc. These conductive structures may be specified (designed) to connect with a higher level of conductive lines that has yet to be applied. Chemoepitaxy chemicals (or graphoepitaxy structures) can be deposited onto the entire substrate surface or at designated areas on the substrate. Any existing topography can also be used to define the contact areas with graphoepitaxy. After the substrate or designated areas on the substrate is marked (with either the chemoepitaxy or graphoepitaxy) a DSA block copolymer film is deposited, such as by spin-on techniques. The block copolymer layer is then activated (such as by applying sufficient heat) such that self-assembly occurs. With the block copolymer film assembled into two different polymers, the substrate is then etched using an etch chemistry that etches a first assembled polymer without etching a second assembled polymer. This creates an array of cylinders, lamella, or line segments on the substrate. An etch process is executed that removes polymer cylinders or lines resulting in defined cylindrical or linear openings (holes). These openings are then filled with conductive material. The second assembled polymer serves to provide an insulating material. In other words, a contact between conductive levels (inter level contact) is created that includes (for example) an array of thousands of small cylinders or lines that cover the substrate, or at least contact point locations. An upper layer of conductive lines can be added, and this upper layer can have a line that crosses over the cylinder array and interfaces with the cylinder array such that there is a connection created between conductive layers as many cylindrical or linear contacts happen to be positioned at a crossover point between conductive structures on the upper and lower layers. The result is a solid connection as long as both the contact point lines overlap somewhere on top of the cylinder array. With multiple cylindrical contacts within a cross over point, even if some cylinders fail to assemble correctly, there are still sufficient electrical contacts to provide a sufficient electrical connection between the lower layer features and the upper layer features.

Referring now to FIG. 1, embodiments include a method for creating electrical contacts on a substrate. A substrate 100 is provided or created having a first conductive structure 111 positioned on the substrate 100. First conductive structure 111 can be a metal line or gate of a transistor, etc. At least an upper surface of first conductive structure 111 can be exposed, that is, uncovered for subsequent contact with this structure. First conductive structure 111 can be part of a lower layer of the substrate 100, which can be generally planar and include a dielectric or insulating material. Note that any number of underlying layers and materials can be included in the substrate 100.

Figure 2:
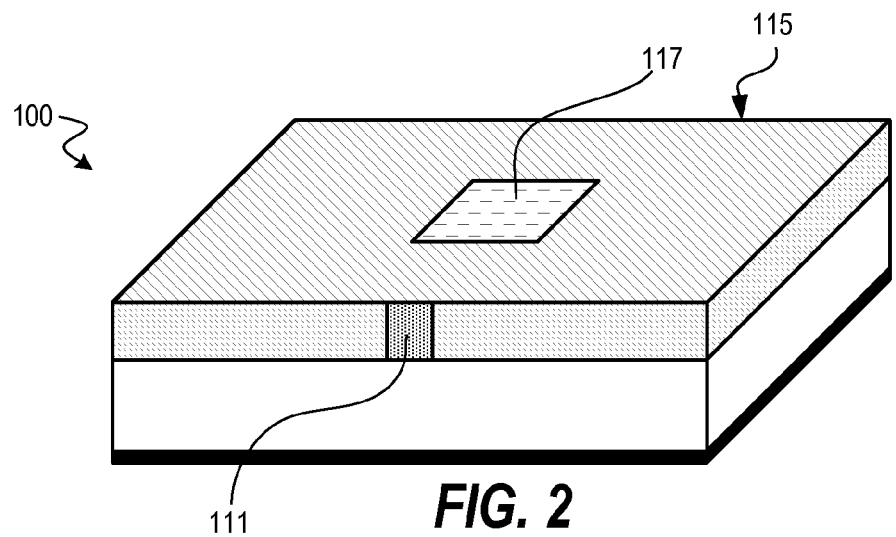

A pre-pattern layer 115 is deposited on substrate 100 as shown in FIG. 2. Pre-pattern layer 115 can be configured to enable directed self-assembly of block copolymers. The pre-pattern layer 115 can optionally define a contact location 117 to connect the first conductive structure 111 on a lower layer with a second conductive structure on an upper layer (not yet shown).

Figure 3:
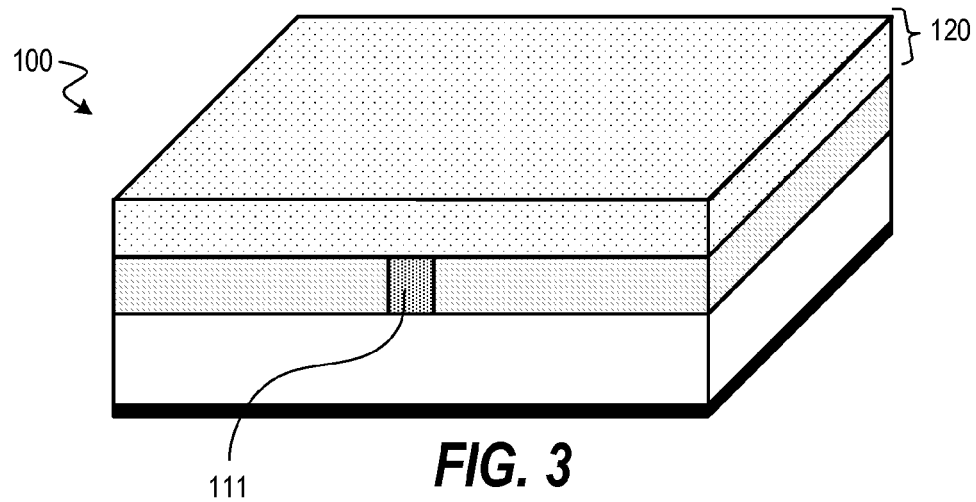
Figure 4:
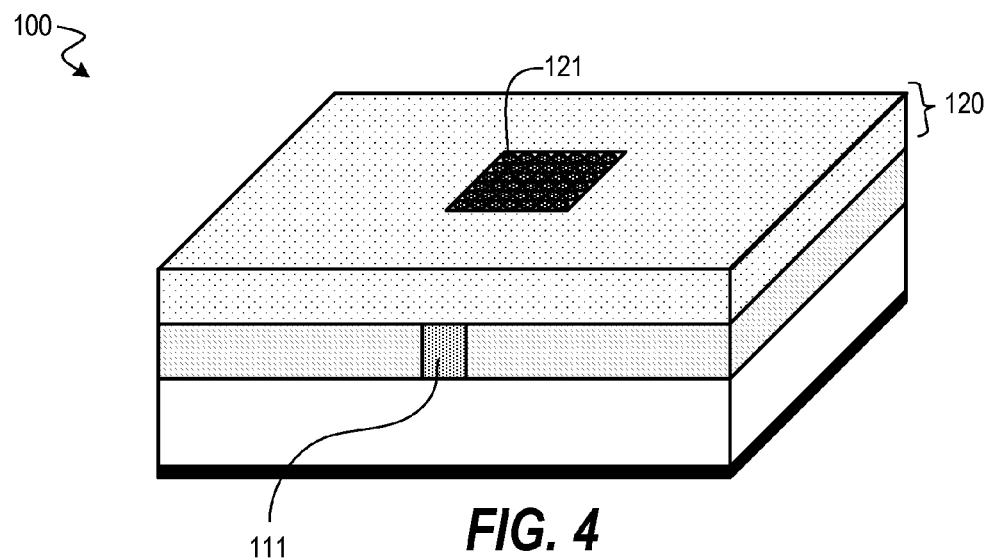
Figure 5:
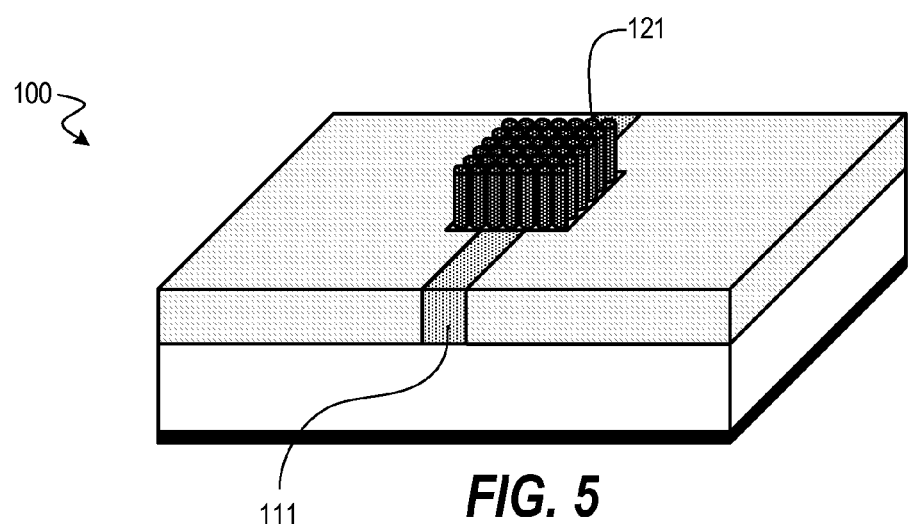

In FIG. 3 a block copolymer film 120 is deposited on the substrate 100. Block copolymer mixtures are conventionally available and known. A particular block copolymer can be selected based on various considerations such as subsequent etching chemistry, physical properties, average nanostructure size, etc. Phase separation of the block copolymer film is activated such that a first assembled polymer 121 forms an array of cylinders at the contact location 117 surrounded by a second assembled polymer 122 as shown in FIG. 4. In some embodiments a width of the defined contact location 117 is greater than a width of the first conductive structure 111, and can even cover an entire substrate surface. Individual cylinders created can have a diameter less than a width of conductive features to be connected, such as metal lines or gates. FIG. 5 is a cut-away illustration showing first assembled polymer 121 without illustrating second assembled polymer 122 and any remaining material from block copolymer film 120. Note that first assembled polymer 121 is essentially an array of vertically oriented cylinders having some spacing between each other.

Figure 6:
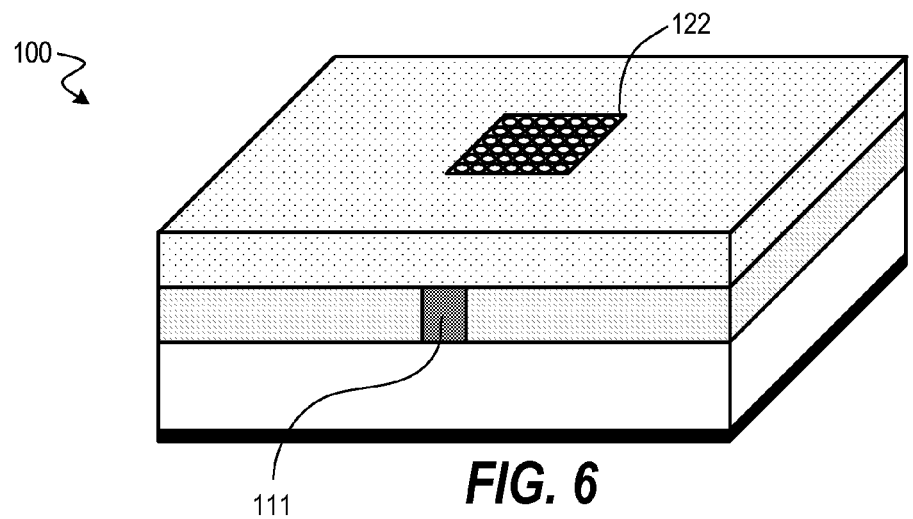
Figure 7:
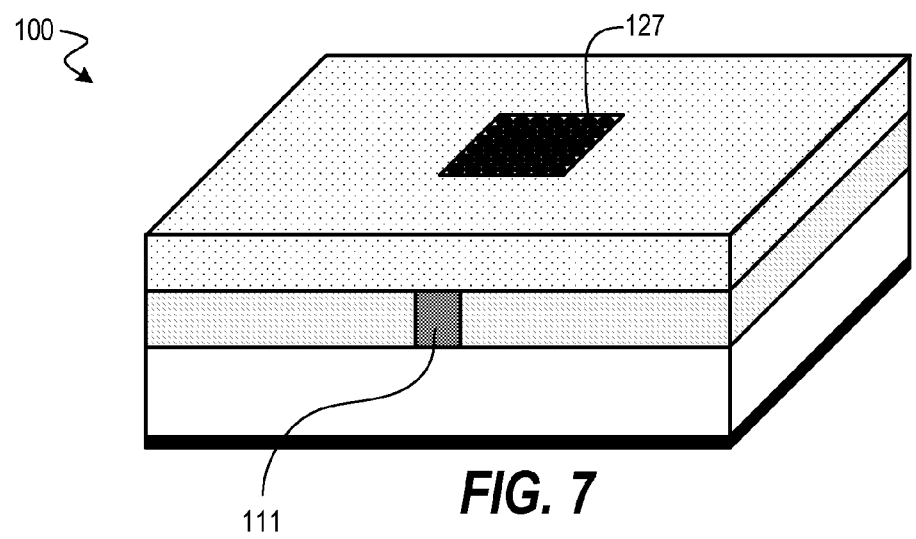

In FIG. 6, the first assembled polymer 121 is removed while the second assembled polymer 122 remains on the substrate and defines an array of cylindrical openings. Removing the first assembled polymer 121 can include executing an etching process that etches the first assembled polymer at an etch rate greater than five times an etch rate of the second assembled polymer. In other embodiments a functional result can be achieved even with an etch rate difference of only two times, but process flow typically benefits from higher selectivity between polymer materials. Such an etching process can include a plasma-based anisotropic etch using reactive chemistry to remove one polymer without removing (or without substantially removing) a counterpart polymer.

One or more electrical contacts 127 are formed by filling the array of cylindrical openings with an electrically conductive material (vertically oriented contacts or normal to a working surface of the substrate). Any conventionally filling technique can be used such as electroplating and subsequent planarization. At this point, there is essentially a layer or portion of a layer that has an array of vertically oriented and electrically isolated electrical contacts. A portion or number of these electrical contacts 127 will touch first conductive structure 111.

Figure 8:
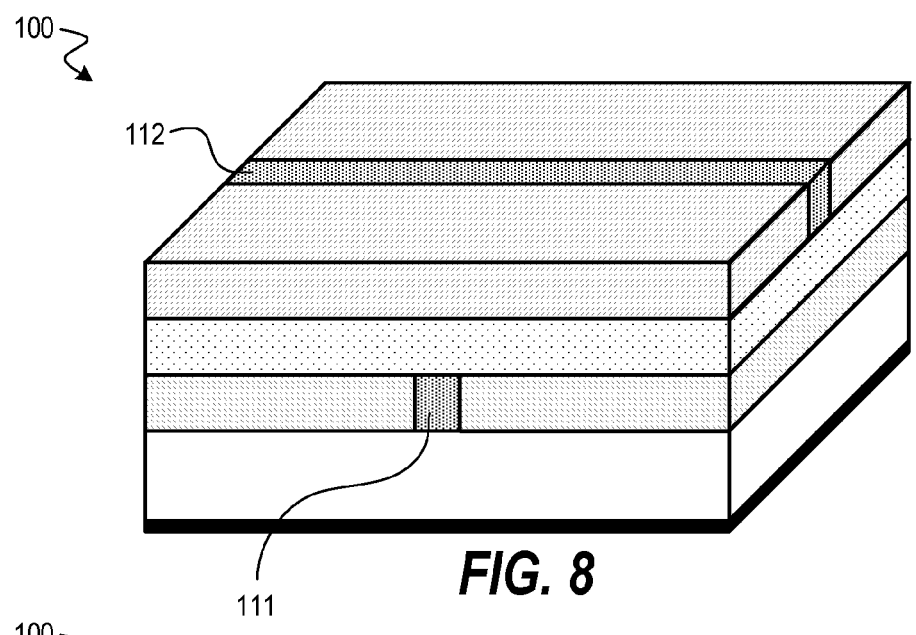

In FIG. 8, a second conductive structure 112 is formed on the block copolymer film such that the second conductive structure 112 is in electrical contact with multiple electrical contacts, which can include crossing the contact location 117. This second conductive structure 112 can include a non-conductive material positioned on sides of the conductive structure. In other words, this can be a layer having metal lines within a dielectric material. Thus, the first conductive structure and the second conductive structure can be lines that elevationally cross each other such that a projected overlap area of the first conductive structure and the second conductive structure is less than a surface area of the defined contact location. The defined contact location can have a cross-sectional area greater than an area sufficient to provide electrical contact with the first conductive structure. In other words, an array of metal cylinders can be oversized for a contact area.

Figure 9:
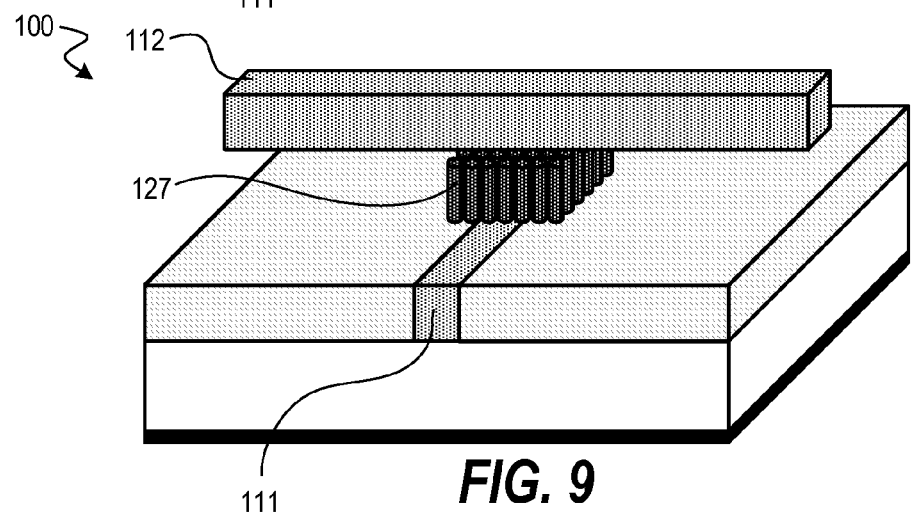

FIG. 9 illustrates the substrate 100 with certain materials visibly removed for convenience in showing how an array of electrically conductive array of vertically-oriented electrical contacts can electrically connect metal lines on two different layers. Because each individual cylinder is electrically isolated from each other, an electrical connection only forms through vertical contacts that touch both a lower metal runner and an upper metal runner. Moreover, because of the electrical isolation of individual vertical contacts, there is no electrical shorting—only where circuits intersect (elevationally or from a top view) is a connection made.

Note that vertical contacts do not need to be cylinders. Such vertical contacts can also be embodied as lines/lamella in either a parallel pattern or the so called "fingerprint" pattern that is a possible self-assembly formation of block copolymers. Long lines and spacers can be routed so that all horizontal connections will automatically connect. Line embodiments of the vertical contacts can be useful for spreading current over interactive films, such as with light emitting diodes (LEDs) and solar films.

Figure 10:
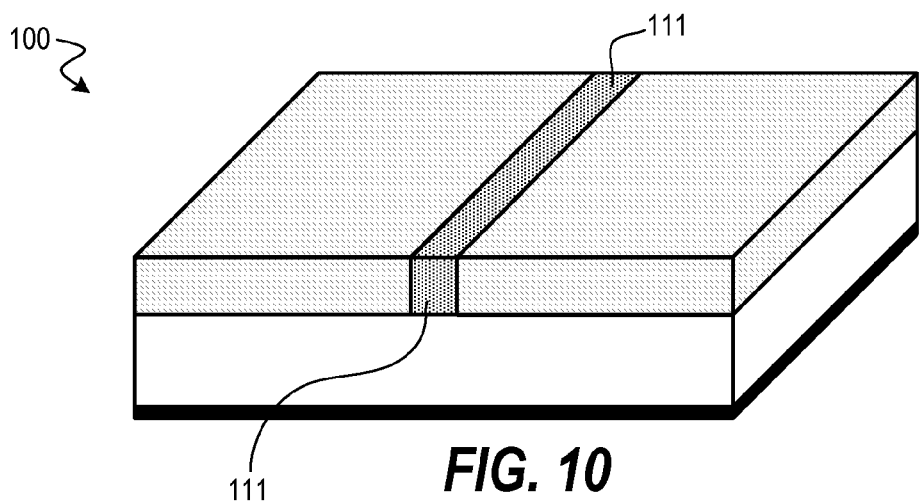
Figure 11:
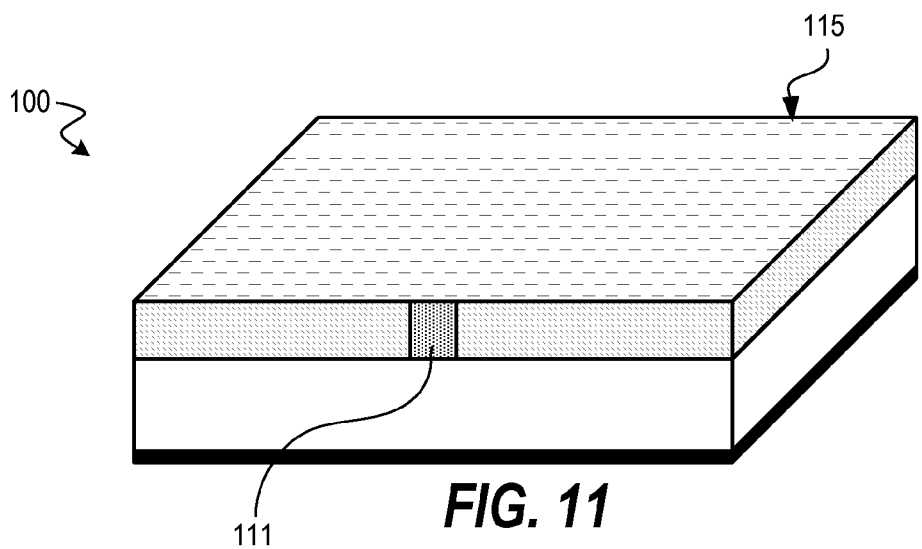

Referring to FIG. 10, another embodiment includes a method for creating electrical contacts on a substrate. A substrate 100 is provided having a first conductive structure 111 positioned on the substrate. First conductive structure can be positioned within a dielectric film or other material. Depending on surface properties of the substrate, a pre-pattern layer 115 can optionally be deposited on substrate 100 as shown in FIG. 11. Pre-pattern layer 115 can be configured to enable directed self-assembly of block copolymers. The pre-pattern layer 115 can be deposited prior to depositing a block copolymer film. Depositing the pre-pattern layer can include depositing a layer of chemoepitaxy or graphoepitaxy configured to guide self-assembly of polymer structures. With chemoepitaxy a marking chemical can attract one of the two block polymers and can be applied at specific locations to guide alignment of self-assembling polymers. With graphoepitaxy, existing or added topology provides physical boundaries within which polymers can self-assemble.

Figure 12:
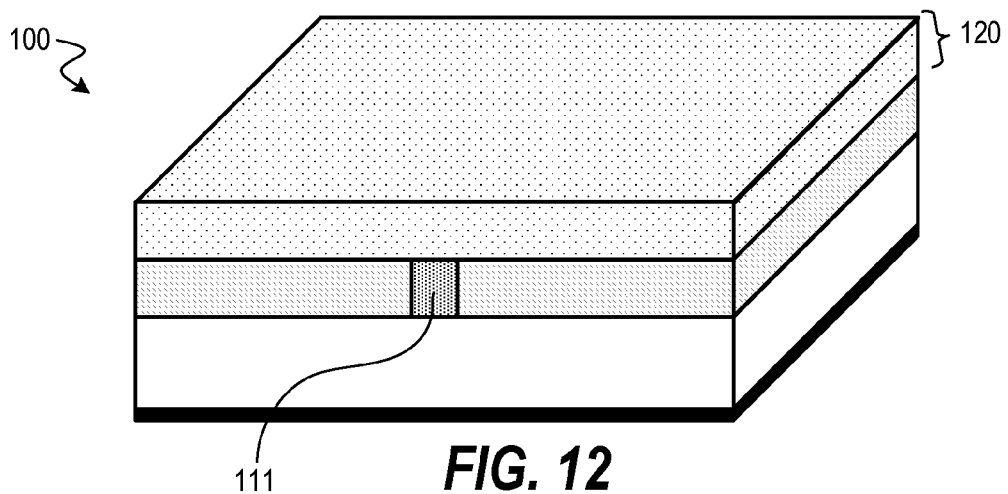

A block copolymer film 120 is deposited on the substrate 100 as shown in FIG. 12. The block copolymer film 120 can include a first polymer and a second polymer. Any deposition technique can be used such as spin coating, spray coating, or dip coating techniques using a predetermined ratio of Kai, N, to volume to create the vertical structures.

Figure 13:
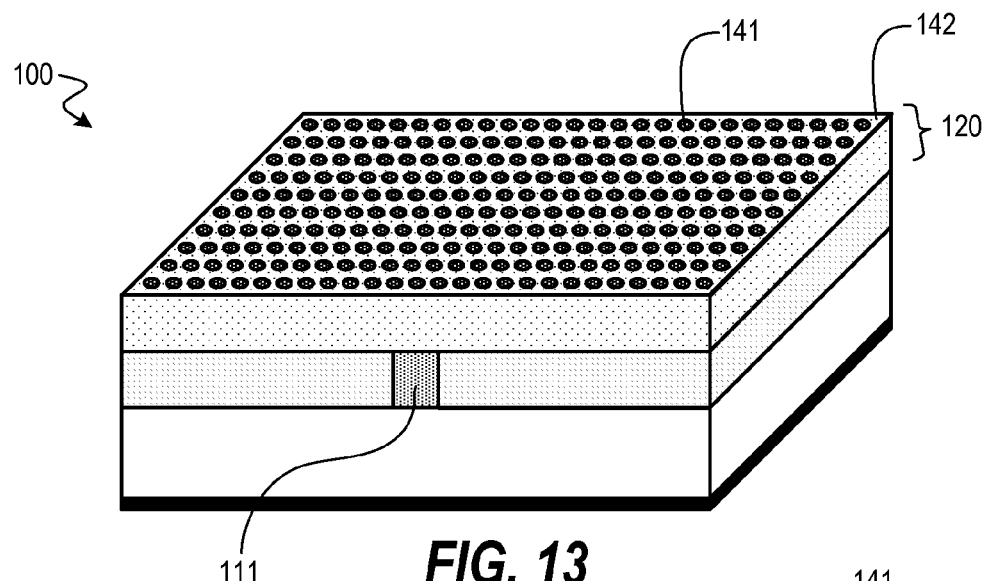
Figure 14:
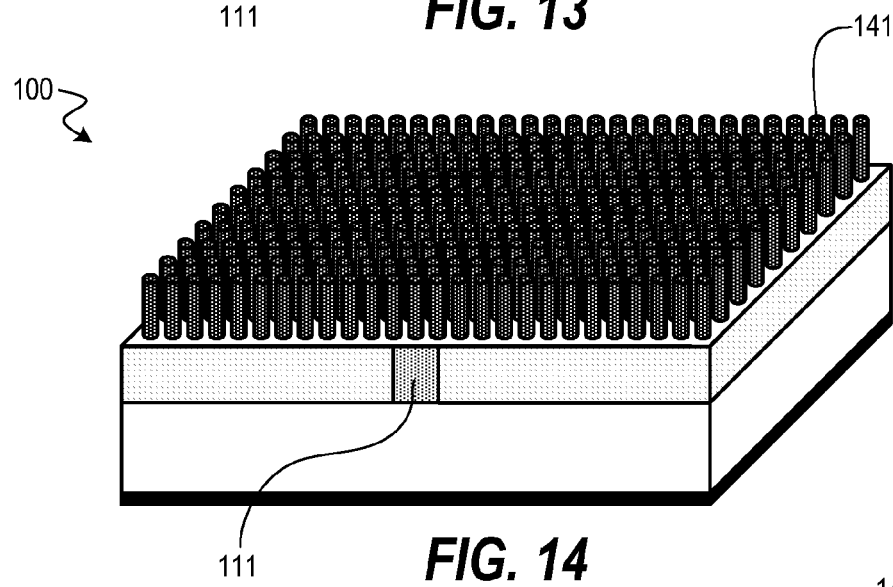

Referring now to FIG. 13, phase separation of the block copolymer film is activated such that a plurality of first structures 141 are formed comprising the first polymer, and such that one or more second structures 142 are formed comprising the second polymer. Individual structures from the plurality first structures being vertically-oriented and electrically insulated from each other by the one or more second structures 142. Multiple individual structures from the plurality first structures are in contact with the first conductive structure 111. Note that vertically-oriented is relative to the substrate or an upper planar surface of the substrate. Thus, vertically-oriented refers to being normal or perpendicular to a working surface of the substrate 100. In some embodiments, a substrate can be held horizontally (relative to the earth's surface) or vertically or otherwise, but the vertical orientation is normal to a working surface of the substrate. For convenience, FIG. 14 illustrates what the substrate 100 would look like with the one or more second structures 142 removed. Note that FIG. 14 shows an array of structures essentially protruding from a working surface of substrate 100, and that each structure is separated from adjacent structures.

Figure 15:
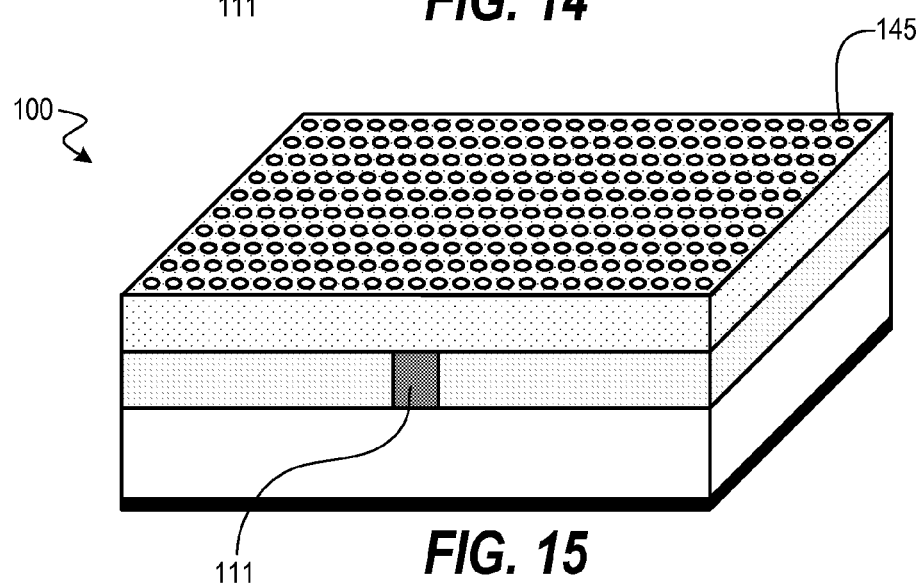

In FIG. 15, the plurality of first structures 141 is removed from the substrate 100 while the one or more second structures 142 remain on the substrate and define vertical openings 145. For example, the first polymer can be selected as a relatively softer polymer that etches easily, while the second polymer is a comparatively harder material that is etch resistant. According, a particular etch step can be executed to remove the first polymer material. Such an etch step can in a wet or dry etch. For example, liquid chemistry can be used to dissolve and wash away the first polymer material. Alternatively, an isotropic or anisotropic plasma-based etch can be executed.

Figure 16:
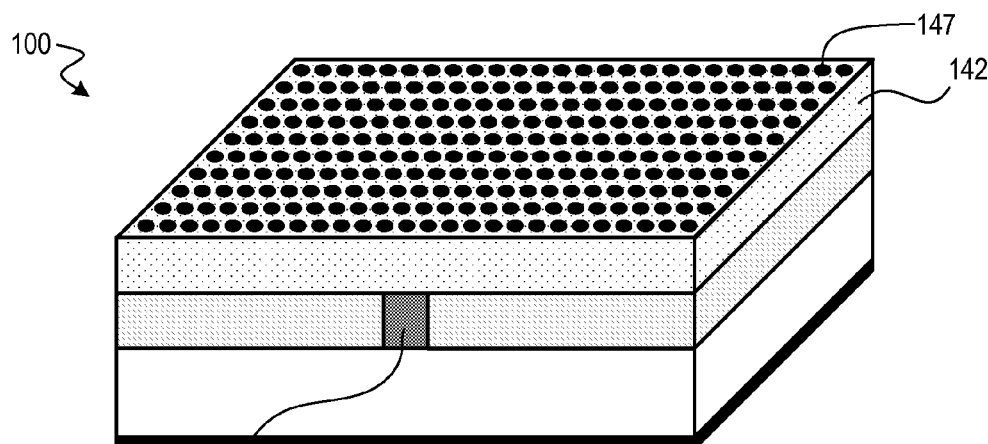

Referring now to FIG. 16, electrical contacts 147 are then formed by filling the defined vertical openings with an electrically conductive material, such as metal. The result is a plurality, grid, array or pattern of metal structures positioned normal to a working surface of the substrate 100 and electrically isolated (insulated) from each other. Electric isolation can be provided by the one or more second structures 142 (second polymer material) which can be a dielectric. In some embodiments, the second polymer can be removed and replaced by a preferred insulating material. In yet other embodiments, the second polymer can be removed and left open as insulating space.

Figure 17:
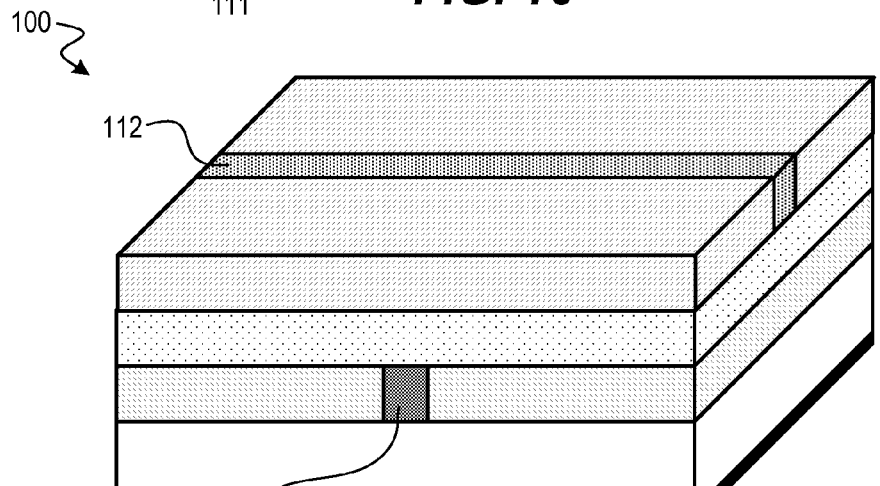
Figure 18:
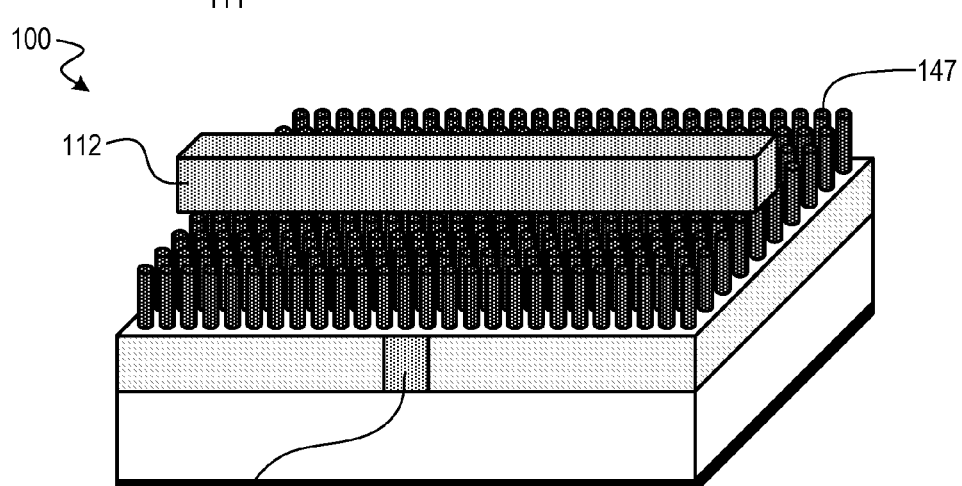

A second conductive structure 112 can be positioned on the block copolymer film such that the second conductive structure 112 is in electrical contact with multiple electrical contacts, as shown in FIG. 17. A portion of the electrical contacts can then electrically connect the first conductive structure 111 to the second conductive structure 112. FIG. 18 is a cut-away illustration showing electrical contacts 147 without illustrating surrounding material, and showing second conductive structure 112 without illustrating surrounding insulating material. Note that electrical contacts 147 are illustrated as an array of metal cylinders with a longitudinal axis being perpendicular to a working surface of the substrate and having spacing between each other.

In some embodiments, the plurality of first structures includes an array of cylinders surrounded by the one or more second structures such that the electrical contacts are electrically isolated from each other. In other embodiments, the plurality of first structures are lines or line segments. The first conductive structure 111 can be a gate structure of a transistor or a metal line. The first conductive structure and the second conductive structure can be metal lines that elevationally cross each other at a projected overlap area, wherein multiple electrical contacts electrically connect the first conductive structure to the second conductive structure at the crossing point. Embodiments can also include defining a contact location on the substrate with this contact location being an area in which the plurality of first structures is formed. In other words, either an entire substrate can have a layer of vertical electrical contacts formed, or else specific designated sections only can be prepared for electrical contact formation.

Another embodiment includes providing a substrate having a pattern of first conductive linear structures that form a portion of an upper planar surface of the substrate. The substrate is patterned such that contact areas are defined with an oversized directed self-assembly pattern that is larger than a design-specified contact cross-section. A block copolymer film is deposited and phase separation of the block copolymer film is activated, typically by application of heat such as in a bake unit. An etching process is executed that etches a first assembled polymer without etching a second assembled polymer, resulting in an array of cylinders defined in each contact area, which contact area can be an entire working surface of a substrate. Defined cylinders are filled with a conductive material, and a layer of second conductive linear structures is positioned that includes a conductive linear structure in contact with the filled cylinders.

This contact creation technique herein creates contacts more efficiently and with less error, more stability, and faster than conventional contact creation methods. For example, techniques herein do not require a photolithographic scanner/stepper to create contacts, leaving the entire contact process on a coater/developer tool saving transport time and process cost. Such a DSA layer of contacts can be created for each contact point with essentially 100 percent accuracy because an error can be decreased to as small as desired. The contact creation process herein creates an array of cylinders over the contact area but also exceeds the required contact point requirements to account for any wanted amount of error. Cylinder placement for a given contact does not need to be precisely positioned because an oversized array of cylinders can be created to easily cover a contact area and provide essentially automatic contacts after an upper electrical layer is created. A given contact block can be a relatively large array of thousands of microscopic cylindrical contacts covering the targeted contact points. If one or more cylinders fail to self-assemble during phase separation, this failure is not an issue because there can dozens or hundreds of cylinders for a given contact point, thus providing redundancy, thus DSA error is insignificant.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for creating electrical contacts on a substrate, the method comprising:
   providing a substrate having a first conductive structure positioned on the substrate;
   depositing a pre-pattern layer configured to enable directed self-assembly of block copolymers, the pre-pattern layer defining a contact location to connect the first conductive structure on a lower layer with a second conductive structure on an upper layer;
   depositing a block copolymer film on the substrate;
   activating phase separation of the block copolymer film such that a first assembled polymer forms an array of cylinders at the contact location surrounded by a second assembled polymer;
   removing the first assembled polymer while the second assembled polymer remains on the substrate and defines an array of cylindrical openings;
   forming a vertical contact by filling the array of cylindrical openings with an electrically conductive material; and
   depositing the second conductive structure on the block copolymer film such that the second conductive structure is in electrical contact with the vertical contact and crosses at least a portion of the vertical contact,
   wherein the first conductive structure and the second conductive structure are lines that elevationally cross each other such that a projected overlap area of the first conductive structure and the second conductive structure is less than a surface area of the defined contact location.

2. The method of claim 1, wherein the second conductive structure includes non-conductive material on sides of the second conductive structure.

3. The method of claim 2, wherein at least an upper surface of the first conductive structure is exposed prior to depositing the pre-pattern layer.

4. The method of claim 1, wherein a width of the defined contact location is greater than a width of the first conductive structure.

5. The method of claim 1, wherein a width of the defined contact location is greater than a width of the second conductive structure, and wherein a diameter of the cylinders is less than a width of the second conductive structure.

6. The method of claim 1, wherein removing the first assembled polymer includes executing an etching process that etches the first assembled polymer at an etch rate greater than five times an etch rate of the second assembled polymer.

7. The method of claim 1, wherein the defined contact location has a cross-sectional area greater than an area sufficient to provide electrical contact with the first conductive structure.

8. The method of claim 1, wherein the first conductive structure is a gate structure of a transistor or a metal line.

9. A method for creating electrical contacts on a substrate, the method comprising:

providing a substrate having a first conductive structure positioned on the substrate;

depositing a block copolymer film on the substrate, the block copolymer film including a first polymer and a second polymer;

activating phase separation of the block copolymer film such that a surrounded plurality of first structures including an array of cylinders are formed comprising the first polymer and such that one or more second structures are formed comprising the second polymer, individual structures from the surrounded plurality of first structures including the array of cylinders being vertically-oriented and electrically insulated from each other by the one or more second structures, multiple individual structures from the surrounded plurality of first structures including the array of cylinders being in contact with the first conductive structure;

removing the surrounded plurality of first structures including the array of cylinders from the substrate while the one or more second structures remain on the substrate and define vertical openings;

forming electrical contacts by filling the defined vertical openings with an electrically conductive material; and positioning a second conductive structure on the block copolymer film such that the second conductive structure is in electrical contact with a plurality of the electrical contacts, wherein the first conductive structure and the second conductive structure are metal lines that elevationally cross each other at a projected overlap area, wherein a portion of the plurality of the electrical contacts electrically connect the first conductive structure to the second conductive structure at the projected overlap area.

10. The method of claim 9, further comprising depositing a pre-pattern layer configured to enable directed self-assembly of block copolymers, the pre-pattern layer being deposited prior to depositing the block copolymer film.

11. The method of claim 10, wherein depositing the pre-pattern layer includes depositing a layer of chemoepitaxy or graphoepitaxy configured to guide self-assembly of block copolymers.

12. The method of claim 9, further comprising defining a contact location on the substrate, the defined contact location being an area in which the plurality of first structures is formed.

13. The method of claim 12, wherein a width of the defined contact location is greater than a width of the first conductive structure.

14. The method of claim 9, wherein the plurality of first structures are lines or line segments.

15. The method of claim 9, wherein the second conductive structure includes non-conductive material on sides of the second conductive structure.

16. A method for creating electrical contacts on a substrate, the method comprising:

providing a substrate having a first conductive structure positioned on the substrate;

depositing a pre-pattern layer configured to enable directed self-assembly of block copolymers, the pre-pattern layer defining a contact location to connect the first conductive structure on a lower layer with a second conductive structure on an upper layer;

depositing a block copolymer film on the substrate;

activating phase separation of the block copolymer film such that a first assembled polymer forms an array of cylinders at the contact location surrounded by a second assembled polymer;

removing the first assembled polymer while the second assembled polymer remains on the substrate and defines an array of cylindrical openings;

forming a vertical contact by filling the array of cylindrical openings with an electrically conductive material; and depositing the second conductive structure on the block copolymer film such that the second conductive structure is in electrical contact with the vertical contact and crosses at least a portion of the vertical contact, wherein a width of the defined contact location is greater than a width of the first conductive structure, the width of the defined contact location is greater than a width of the second conductive structure, and a diameter of the cylinders is less than the width of the second conductive structure.

17. The method of claim 16, wherein the second conductive structure includes non-conductive material on sides of the second conductive structure.

18. The method of claim 17, wherein at least an upper surface of the first conductive structure is exposed prior to depositing the pre-pattern layer.

19. The method of claim 16, wherein removing the first assembled polymer includes executing an etching process that etches the first assembled polymer at an etch rate greater than five times an etch rate of the second assembled polymer.

* * * * *